(12) United States Patent
Stahl et al.

(10) Patent No.: US 6,557,624 B1
(45) Date of Patent: May 6, 2003

(54) CONFIGURABLE SYSTEM AND METHOD FOR COOLING A ROOM

(75) Inventors: Lennart Stahl, Plano, TX (US); Christian L. Belady, McKinney, TX (US)

(73) Assignee: Liebert Corporation, Columbus, OH (US)

(*) Notice: Subject to any disclaimer, the term of this patent is extended or adjusted under 35 U.S.C. 154(b) by 0 days.

(21) Appl. No.: 09/635,374

(22) Filed: Aug. 9, 2000

(51) Int. Cl.[7] .............................. F24H 9/06; F24H 3/02; F24F 7/007
(52) U.S. Cl. ...................... 165/53; 165/121; 454/186
(58) Field of Search ........................ 165/53, 96, 121, 165/122; 454/184, 186; 361/695, 696

(56) References Cited

U.S. PATENT DOCUMENTS

| | | | | |
|---|---|---|---|---|
| 3,868,158 A | * | 2/1975 | Laboue ..................... | 312/350 |
| 4,786,300 A | | 11/1988 | Uematsu et al. ............ | 62/259.1 |
| 5,005,372 A | * | 4/1991 | King ........................... | 62/244 |
| 5,029,451 A | | 7/1991 | Imaiida et al. ............. | 62/259.1 |
| 5,184,474 A | * | 2/1993 | Ferdows .................... | 62/244 |
| 5,218,838 A | | 6/1993 | Kitamoto et al. ............ | 62/288 |
| 5,467,250 A | * | 11/1995 | Howard et al. ............. | 361/696 |
| 5,669,229 A | | 9/1997 | Ohbayashi et al. ........ | 62/259.1 |
| 5,688,169 A | * | 11/1997 | Duong et al. ............... | 454/184 |
| 6,088,224 A | * | 7/2000 | Gallagher et al. ........ | 165/104.33 |
| 6,115,250 A | * | 9/2000 | Schmitt ...................... | 361/695 |

FOREIGN PATENT DOCUMENTS

EP  0458770 A1  11/1994  .......... H05K/7/20

OTHER PUBLICATIONS

International Search Report for PCT/US01/24627 (corresponding PCT case).
Written Opinion for PCT/US01/24627 (corresponding PCT case).

* cited by examiner

Primary Examiner—Henry Bennett
Assistant Examiner—Tho Von Duong
(74) Attorney, Agent, or Firm—Howrey Simon Arnold & White LLP (57) ABSTRACT

A method and system are disclosed for cooling a room having one or more heat generating objects. A number of heat exchangers are disposed adjacent a floor or ceiling and extends substantially entirely or partially between the walls of the room. A fan unit is disposed adjacent the heat exchanger and draws or blows cooled air from the heat exchanger and directs the drawn air into the room. The fan unit is capable of being repositioned along a different portion of the heat exchanger so as to redefine the flow of cooled air into the room. The cooling system components are modularized enabling configuration of a number of components to cool a room.

30 Claims, 5 Drawing Sheets

CONFIGURABLE SYSTEM AND METHOD FOR COOLING A ROOM

CROSS REFERENCE TO RELATED APPLICATIONS

This application is related to U.S. applications for patent, Ser. No. 09/617,213, filed Jul. 17, 2000, entitled "Overhead Cooling System With Selectively Positioned Paths of Airflow", and Ser. No. 09/617,391, filed Jul. 17, 2000, entitled "Reconfigurable System and Method for Cooling Heat Generating Objects", both of which are incorporated herein by reference.

BACKGROUND OF THE INVENTION

1. Technical Field of the Invention

The present invention relates to cooling systems for cooling a room having electronic equipment therein, and particularly to cooling systems for a computer room that are configurable to allow customized air flow in proximity to the location of computer equipment in the computer room.

2. Background and Objects of the Invention

The growth of the computer industry and telephony over the past few decades has been phenomenal. The integration of these technologies, for example, in telecommunications switching systems, has lead to greater and greater efficiencies as larger numbers of communications are handled by fewer components, which are typically housed in a central control room.

One problem inherent with many existing cooling systems for electronic equipment is rigidity. Many existing cooling systems are built into and/or under the flooring of a temperature-controlled room having equipment needing to be cooled. Such cooling systems employ fixed conduits or other piping for directing cooled air along a subsurface of the flooring and upwardly through the floor and towards the equipment to be cooled. The upwardly directed cooled air is in proximity to the equipment. In the event the temperature characteristics within the temperature-cooled room changes, such as by the equipment being moved within the room or by additional equipment being added therein, it is very difficult to modify the cooling system accordingly. For instance, the conduits have to be detached from their fixed positions and repositioned, or replaced in favor of differently sized conduits. Consequently, altering the cooling characteristics of existing cooling systems frequently proves a costly adventure.

Floor-based cooling systems present additional difficulties other than structural rigidity. For instance, floor-based cooling systems that do not utilize conduits for passing cooled air occupy more area so that equipment cabling and other obstructions do not cause uneven air distribution or a reduction in air pressure. Such systems require the equipment cabling to be plenum rated, thereby increasing system cost. Floor-based cooling systems also possess the tendency to distribute noise and vibrations, which may effect the operation of the equipment to be cooled.

In addition, floor-based and other existing cooling systems have a rather limited cooling capability. For instance, existing cooling systems have heat densities of approximately 80 watts per square foot (W/ft$^2$) with planned cooling systems being claimed to possess heat densities of up to 150 W/ft$^2$. Although perhaps adequate for some current systems, cooling systems having such heat densities may not effectively cool many of today's equipment, such as state-of-the-art computational equipment.

As is readily apparent, if equipment is not effectively cooled, the internal temperature of the electronic components in the equipment substantially increases, thereby leading to significantly reduced system performance and, in some cases, total system failure. If a cooling system inefficiently cools the equipment, either the equipment may fail due to increased operating temperature or the costs for cooling the equipment may be unnecessarily high. What is needed, then, is a cooling system having its cooling characteristics closely tailored to the heating characteristics of the equipment to be cooled.

SUMMARY OF THE INVENTION

The present invention overcomes the above-discussed shortcomings and satisfies a significant need for a cooling system for cooling a room having one or more heat generating objects. The cooling system includes at least one heat exchanger disposed beneath the floor and extending substantially entirely between the walls of the room, and a fan unit disposed between the at least one heat exchanger and the floor and being selectively positioned along the at least one heat exchanger so as to draw air therefrom and blow the drawn air into the room, e.g., to a room portion having heat dissipation problems. By positioning the fan unit along the heat exchanger to adjustably provide a cooled airflow proximally to heat generating objects in the room, the present invention provides a reconfigurable cooling system that is selectively customized to particular room cooling requirements. The above reconfigurable system is also applicable to a heat exchanger installed in the ceiling above the various heat generating objects, enabling dual heat exchanging in order to further improve thermal efficiency.

The operation of the embodiment of the present invention includes initially positioning the fan unit in relatively close proximity to one or more heat generating objects in the room. Next, the fan unit draws cooled air through the heat exchanger and blows the drawn air through a first portion of the floor or ceiling into the room near the heat generating objects. In the event thermal characteristics of the room change, the fan unit may be moved along the heat exchanger so that cooled air drawn from the heat exchanger is blown through a second portion of the floor as desired, thereby adjustably configuring the air flow to effectuate cooling.

The present invention is also directed to a system better exploiting the reconfigurability aspects of the above embodiments. In particular, through modularization of the fan units and heat exchangers, cooling difficulties in large rooms may be addressed in an economic manner. The interchangeability and interlinkage of the components would also permit easier repair and less downtime.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 1:
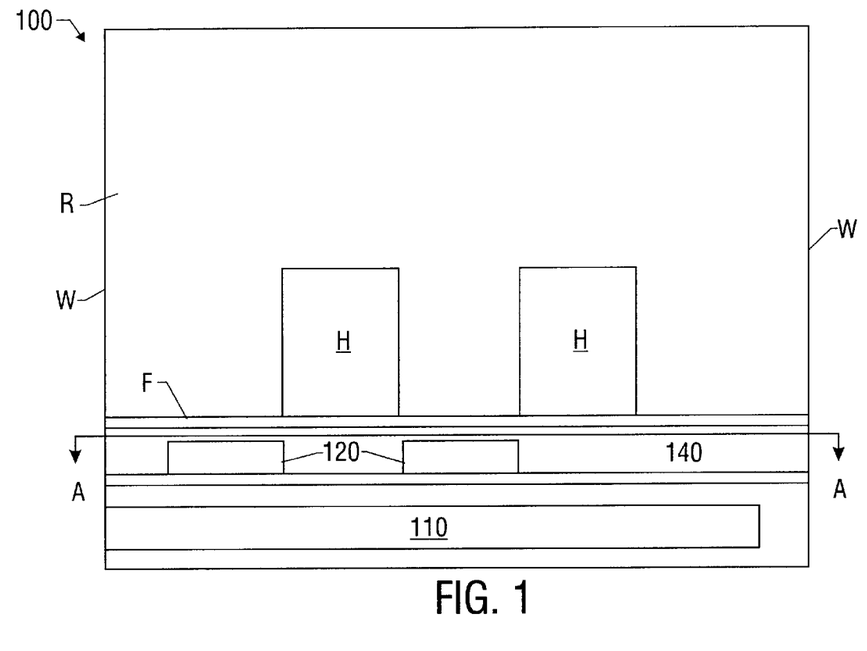
FIG. 1 is a side elevational view of a cooling system in association with a room having heat generating equipment therein in accordance with an embodiment of the present invention having a heat exchanger installed in a subfloor portion of a room.
Figure 2:
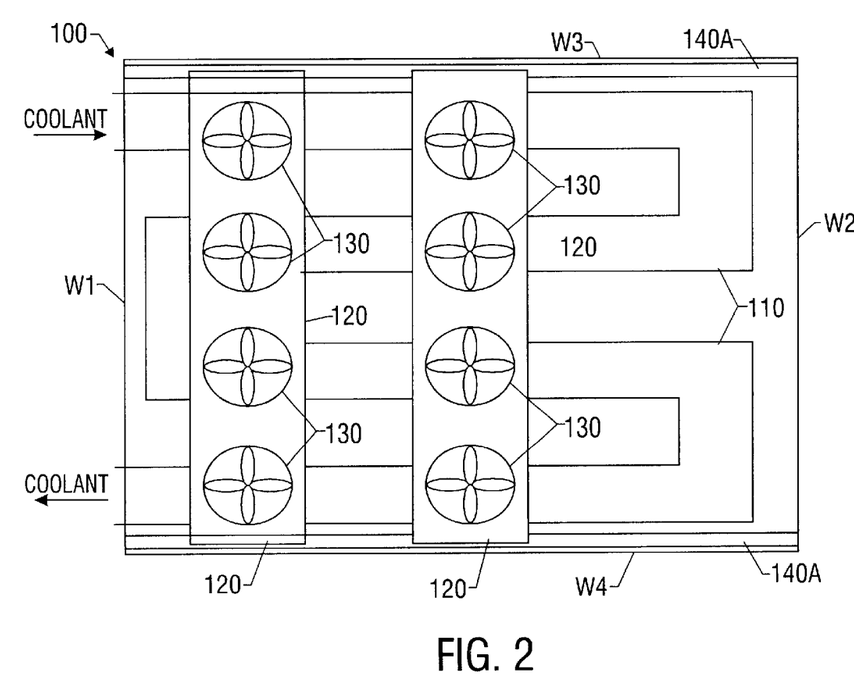
FIG. 2 is a plan view of the cooling system of FIG. 1 taken along the A—A line of FIG. 1.
Figure 3:
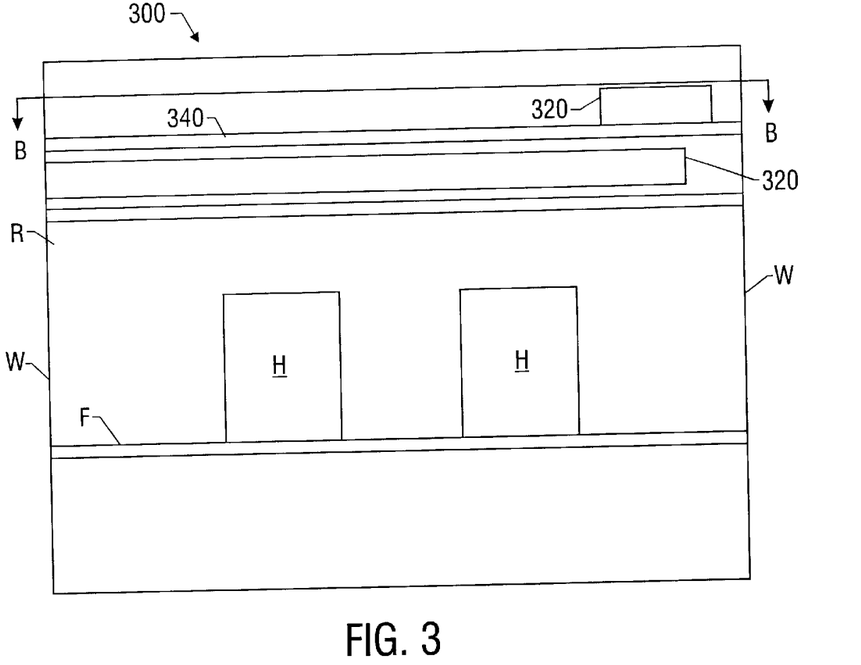
FIG. 3 is a side elevational view of a cooling system in association with a room having heat generating equipment therein in accordance with another embodiment of the present invention having a heat exchanger installed in a ceiling portion of a room.

Referring to FIGS. 1–3, there is shown a cooling system, generally designated by the reference numeral 100, according to an embodiment of the present invention. Cooling system 100 is adapted to provide cooled air to a room, generally designated by the reference symbol R, such as a room having electronic equipment or other heat generating objects H therein. Room R has a raised floor F that allows air to pass therethrough, such as a floor F having a grid-like pattern, permitting air to permeate therethrough.

Cooling system 100 includes at least one heat exchanger 110 through which a coolant fluid is passed. Heat exchanger 110 may be a cooling coil or other comparable device, as is understood in the art, and is preferably disposed substantially horizontal with respect to the floor F. Air is cooled by being directed through or in proximity to the heat exchanger 110. According to the embodiment of the present invention shown in FIG. 1, and shown in FIG. 2 in a sectional plan view along the A—A line, heat exchanger 110 is sized so as to extend along floor F substantially entirely between the walls W of room R, individually designated for convenience in FIG. 2 as W1, W2, W3 and W4. In this way, air is capable of passing in a transverse (vertical) direction through or in proximity to the heat exchanger 110 entirely along floor F and cooled thereby. Coolant temperature and flow rate within the heat exchanger 110 may be controlled manually or automatically, as is understood in the art.

In order to focus a flow of cooled air from heat exchanger 110 towards heat generating objects H in room R, cooling system 100 preferably includes one or more fan units 120. Fan units 120 are preferably disposed between the heat exchanger 110 and the floor F. Fan units 120 are adjacent only a portion of the surface of the heat exchanger 110, as shown by the plan view of cooling system 100 in FIG. 2. In this embodiment, each fan unit 120 is operated to draw cooled air from the heat exchanger 110 and blow the drawn air upwards into room R, thereby cooling the heat generating objects H disposed therein.

Each fan unit 120 preferably includes one or more individual fans 130. The operating speed of the fans 130 may be fixed, manually varied or automatically varied to provide the desired cooling capacity. Although each fan unit 120 is shown as including four discrete fans 130 (FIG. 2), it is understood that the number of fans 130 in each fan unit 120 may vary depending upon the operating requirements of cooling system 100. It should also be understood that the individual fans 130 may be vertically aligned to direct the air upwards or may be individually adjustable to more directly fine-tune the cooling, e.g., the fans 130 pivot about one or more axes to permit more angular air flows, if desirable.

Cooling system 100 may include a tray or frame assembly 140 disposed between the heat exchanger 110 and the floor F, by which the fan units 120 (and fans 130) are supported. Tray assembly 140 may be attached to the heat exchanger 110. Alternatively, tray assembly 140 may be unattached to the heat exchanger 110. Tray assembly 140 may include a pair of ledges 140A, which are in substantially parallel relation to each other. Referring to the embodiment shown in FIG. 2, each ledge 140A extends from one wall W1 to another wall W2 opposite thereto. End portions of the fan units 120 rest on the ledges 140A of the tray assembly 140. It is understood, however, that the fan units 120 may be attached to the tray assembly 140 using other mechanisms, such as screws, nuts and bolts, clamp mechanisms or the like. Although FIG. 2 shows the ledges 140A disposed parallel to walls W3 and W4, it is understood that the ledges 140A may be instead (or additionally) disposed in a spaced relation from parallel walls W3 and W4.

Fan units 120 may be positioned along the heat exchanger 110 and/or tray assembly 140 so as to blow cooled air in proximity to heat generating objects H in room R. As is understood in the art, with the fan units 140 being supported by ledges 140A, the fan units 140 may be selectively repositioned or slidably disposed along the tray assembly 140 and the heat exchanger 110. In this way, cooling system 100 is reconfigurable to account for changes in the temperature characteristics of room R, such as changes due to new heat generating objects H being placed in room R or existing heat generating objects H being moved therein, deleteriously or suboptimally altering the air flow.

Representative air flows within room R are designated by the reference numeral 150A, both rising and falling, which upon passing through the permeable floor F, designated by the reference numeral 150B, and through the heat exchanger 110, are cooled thereby. The cooled air, designated by the reference numeral 150C is then blown upward into room R, as illustrated.

Figure 4:
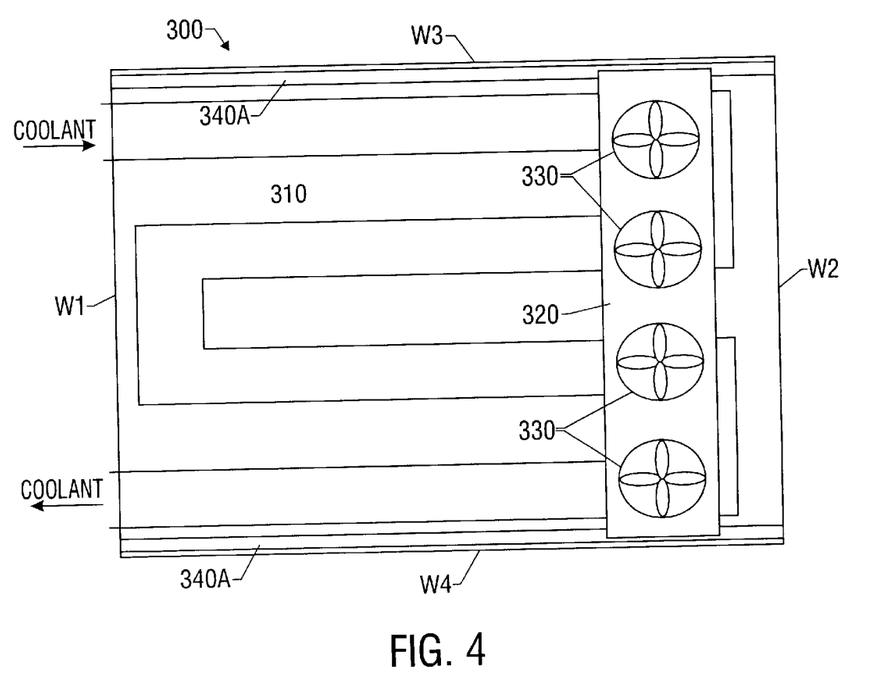
FIG. 4 is a plan view of the cooling system of FIG. 3 taken along the B—B line of FIG. 3.

With reference now to FIG. 3, the cooling system, generally designated therein by the reference numeral 300, in this embodiment has a heat exchanger 310, also shown in FIG. 4 in a sectional plan view along the B—B line, and fan units 320 disposed in a ceiling C, overhanging the various heat generating objects H within the room R. In particular, the fan units 320 are also selectively positioned or slidably disposed, and repositioned along ceiling C so as to blow air downwardly into room R through ceiling C, which also has a grid-like pattern allowing passage of air therethrough. As with the orientation to the floor F embodiment of FIGS. 1 and 2, the heat exchanger 310 and fan units 320 parallel and adjacent thereto are substantially horizontal with respect to the ceiling C. Cooling system 300 includes a tray or frame assembly 340 disposed adjacent ceiling C and extending from one end of room R to an opposite end thereof, e.g., from W1 to W2 as illustrated in FIG. 4. Tray assembly 340 includes a pair of ledges 340A that are in substantially parallel relation to each other. Referring to the embodiment shown in FIG. 4, each ledge 340A extends from one wall W1 to another wall W2 opposite thereto. End portions of the fan units 320 rest along the ledges 340A of tray assembly. It is understood, however, that the fan units 320 may be attached to the tray assembly 340 using other mechanisms, such as screws, nuts and bolts, clamp mechanisms or the like. Although FIG. 4 shows ledges 340A disposed along parallel walls W3 and W4, it is understood that the ledges 340A may be instead disposed in spaced relation from parallel walls W3 and W4.

Representative air flows, designated by the reference numeral 350A, in this embodiment rise from the heat generating devices H through the permeable ceiling C and overhead heat exchanger 310 to enter the fan unit 320, the inflow designated by the reference numeral 350B. The air flow 350B is then blown through the fan unit 320 either through the heat exchanger 310 for a second cooling, designated by the reference numeral 350C, or not, designated by the reference numeral 350D, which bypasses the heat exchanger 310. The floor F in this embodiment may or may not be permeable. If permeable, however, as shown for convenience in FIG. 3, then the air flows pass therethrough back into room R, as designated by the reference numeral 350E.

It should be understood from the embodiments shown in FIGS. 1–4 that the fan units 120/320 may be positioned to either draw air through the heat exchanger, such as the embodiment shown in FIGS. 1 and 2, or push air through the heat exchanger, such as the embodiment shown in FIGS. 3 and 4. Accordingly, the fan units may be positioned either way in the respective embodiments to better effectuate the cooling needs and space requirements of the particular room R in question.

Figure 5:
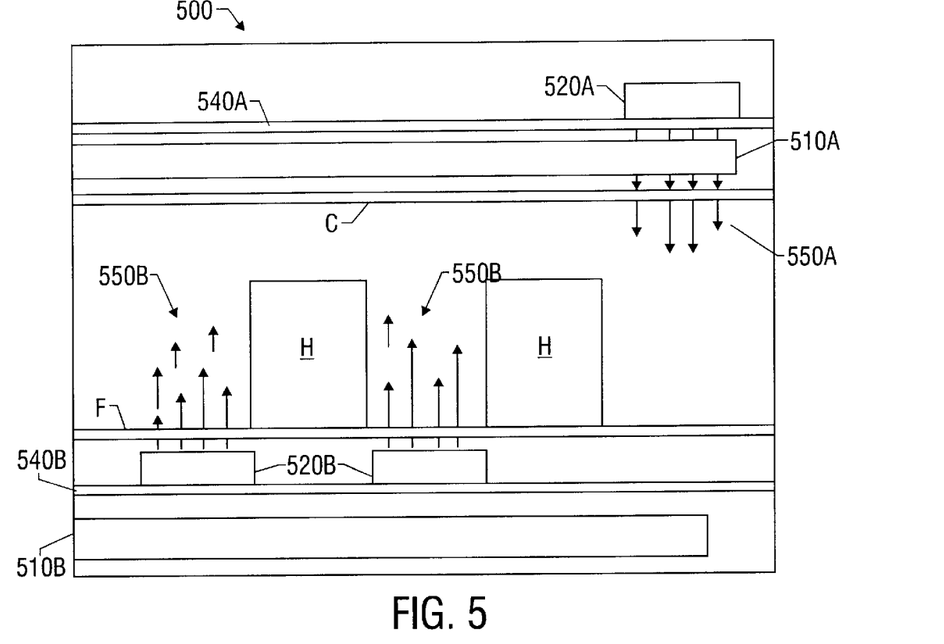
FIGS. 5 and 6 are side elevational views illustrating an operation of the cooling system of FIGS. 1–4.
Figure 6:
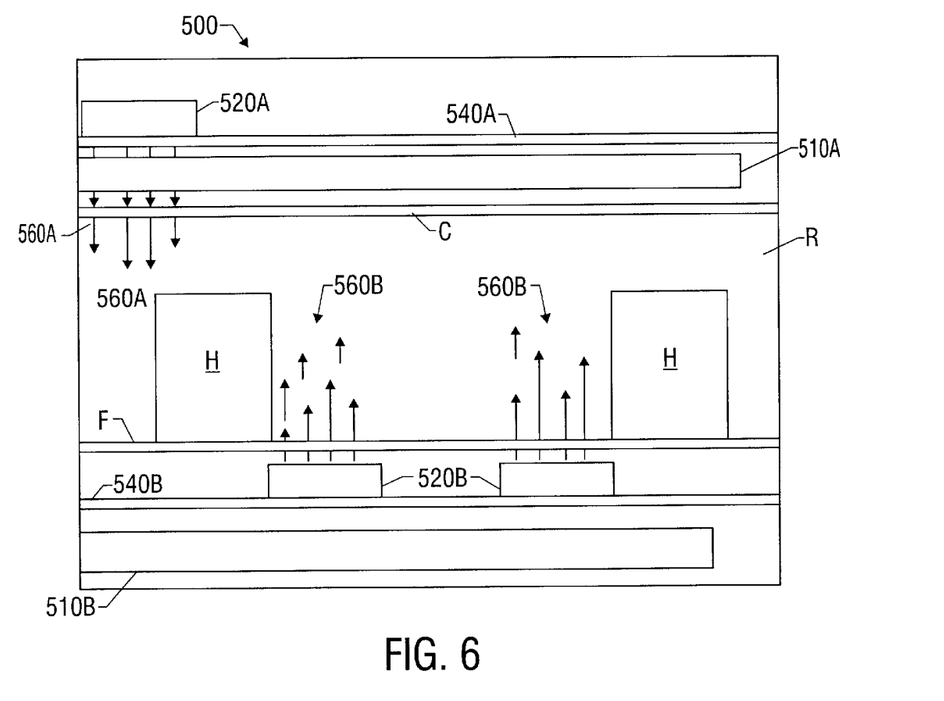

With reference to FIGS. 5 and 6, the operation of a combined cooling system, generally designated by the reference numeral 500, will now be described. As shown in FIG. 5, upper fan unit 520A and lower fan units 520B are initially positioned along respective tray assemblies 540A and 540B so as to be in first positions relative to rows of heat generating objects H disposed therebetween. Fan unit 520A is shown in FIG. 5 positioned along ceiling C in a first position relative to the heat generating objects H disposed below. Next, coolant is forced through a heat exchanger 510A so as to effectively cool air in proximity thereto. The coolant is maintained at the desired temperature and flow rate, under manual or automatic control, as described. The fan unit 520A is then activated to force air through the heat exchanger 510A, as generally illustrated by the reference numeral 550A. The downward air flows then pass the heat generating devices H and through the floor F, as designated by the reference numeral 550B.

Fan units 520B are, in turn, positioned along the floor F in a first position relative to the heat generating objects H disposed above. Coolant is then forced through a heat exchanger 510B, cooling the air in proximity thereto, and fan units 520B draw the cooled air from the heat exchanger 510B, designated by the reference numeral 550C, and blow the cooled air upwards through the floor F along airflow paths, as generally illustrated by the reference numeral 550D. The rising air flows, designated by the reference numeral 550E, pass through the ceiling C and through the heat exchanger 510A for passage to the fan unit 520A to close the cycle.

Fan units 520A and 520B are activated to run at a desired speed, under manual or automatic control, as described. Alternatively, the speed of the fan units 520A and 520B are individually set. Heat exchangers 510A and 510B, which may be interconnected, and fan units 520A and 520B maintain room R at the desired temperature with the desired temperature gradient.

In the event the thermal characteristics within room R change, however, such as due to heat generating objects H being moved or additional heat generating objects H being placed in room R, the fan units 520A and 520B may be repositioned along a different portion of the respective heat exchangers 510A and 510B and/or tray assemblies 540A and 540B accordingly, as illustrated in FIG. 6. Similarly, fan units 520A and 520B may be repositioned along a different portion of ceiling C and floor F, respectively. Once fan units 520A and 520B are repositioned and activated, cooled air from the respective heat exchangers 540A and 540B is blown into room R in proximity to heat generating objects H along other airflow paths, generally designated therein by the reference numerals 560A and 560E, respectively, which should address the heating problems of the new configuration.

One advantage provided by the cooling systems according to the present invention concerns heat density. Cooling systems in accordance with the present invention are capable of handling heat densities of approximately 200 W/ft$^2$ or more, e.g., up to approximately 500 W/ft$^2$. Relative to existing conventional cooling systems, the cooling systems of the present invention are more capable of meeting the cooling demands of tomorrow's heat generating equipment.

Figure 7:
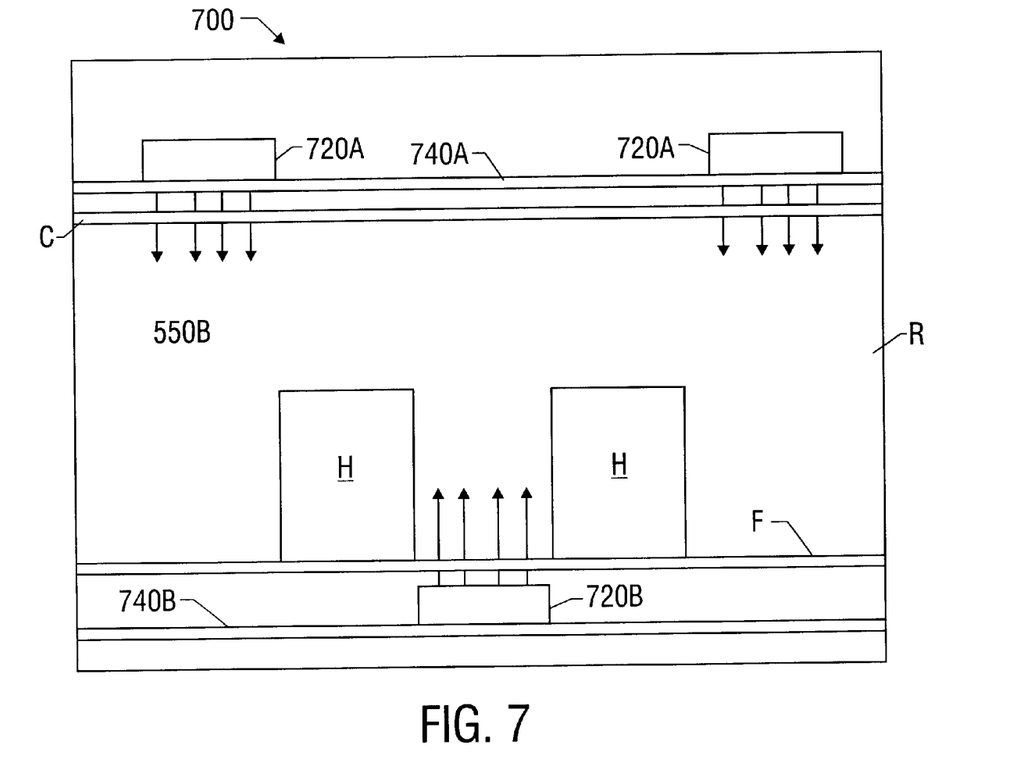
FIG. 7 is a side elevational view of a cooling system in association with a room having heat generating equipment in accordance with a further embodiment of the present invention, having heat exchangers installed in both the subfloor and ceiling portions of the room.

It is understood that heat exchangers 110/310/510 and tray assemblies 140/340/540 may be located in different locations relative to room R. For instance, according to another embodiment of the present invention, a cooling system, generally designated in FIG. 7 by the reference numeral 700, may include a heat exchanger 710 disposed adjacent ceiling C. As shown in FIG. 7, fan units 720A are disposed between the heat exchanger 710 and the ceiling C. When activated, the fan units 720A draw cooled air from the heat exchanger 710 and direct the cooled air downwardly into room R through the gridwork of the ceiling C. A tray and/or frame assembly 740A is disposed between the heat exchanger 710 and the ceiling C to support the respective fan units 720A over ceiling C. The fan units 720A are selectively positioned or slidably arranged along portions of the heat exchanger 710 and/or the tray assembly 740A based in part upon the thermal characteristics of room R. A fan unit 720B is disposed beneath floor F along a tray assembly 740B. When activated, the fan unit 720B blows ambient air upwardly into room R without the benefit of further cooling through a heat exchanger. Representative air flows through cooling system 700 are illustrated by the reference numerals 750A–750E, also illustrating a double cooling aspect of the present invention.

It should, of course, be understood that the heat exchanger in FIG. 7 could alternatively be located below the floor F with the fan unit 720B blowing cooled air upward while the fan units 720A above blow ambient air downwardly, as illustrated. As discussed hereinabove in connection with FIGS. 5 and 6, having heat exchangers and fan units both above and below the heat generating devices H provides better coverage for cooling the devices H from a variety of angles and, by virtue of the increased cooling capacity, provides greater cooling coverage.

It should also be understood that although the embodiments shown cover a room R and via slidable fan units offer coverage of the entire room R, the principles of the present invention may be readily adopted to provide coverage to a portion of a room whether from below, above or both. This "local" solution may be employed to address cooling problems in a portion of a room, e.g., a corner, without subjecting the entire room to the assemblage of heat exchangers, fan units and the like.

Figure 8:
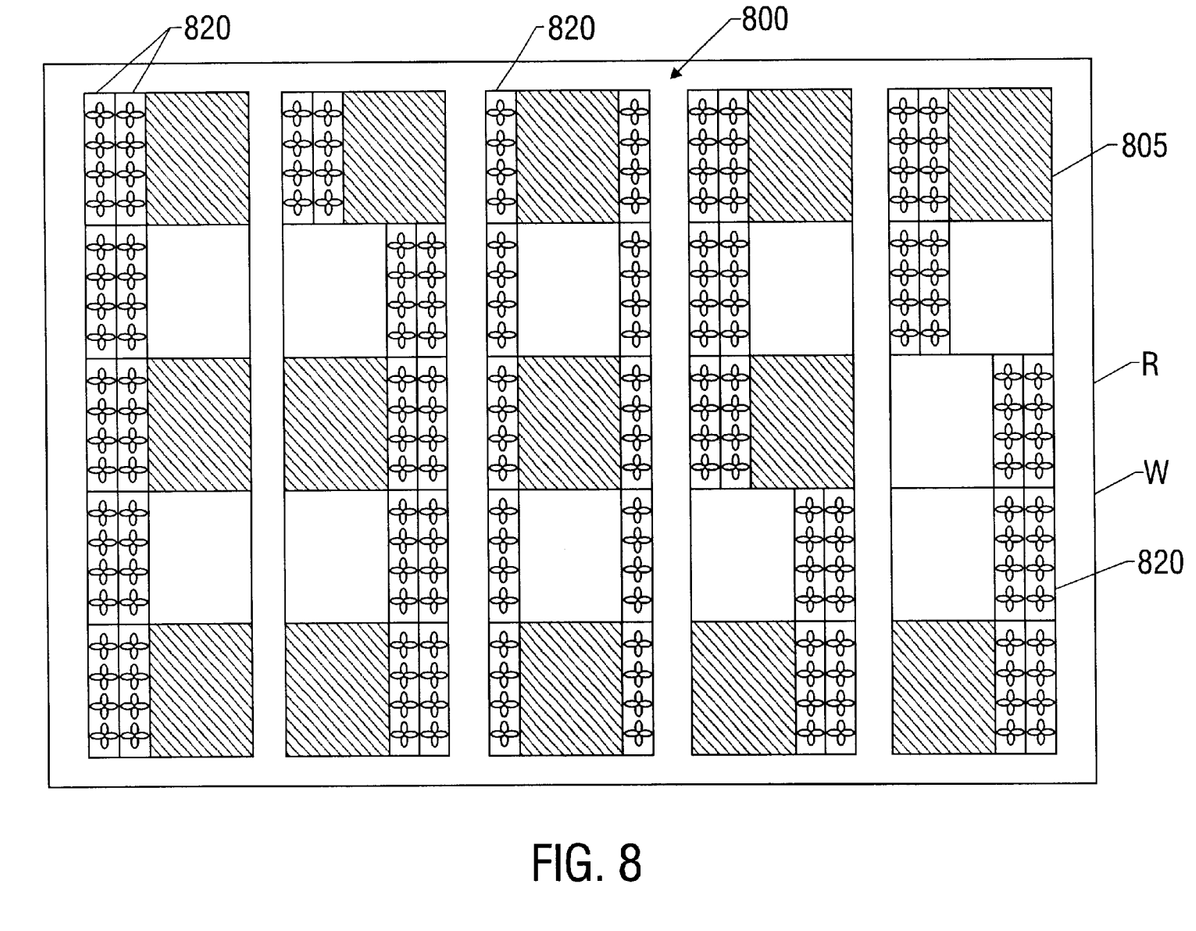
FIG. 8 is a plan view of a modular configuration of numerous cooling system components, as described in connection with FIGS. 1–7, arranged to cool a room.

With reference now to FIG. 8, there is illustrated the modularization of the components described hereinbefore to cover any size room or portion thereof. The transverse or perpendicular view illustrates a configuration either overhanging a room R having walls W, i.e., above the aforedescribed ceiling C, or underneath the floor F, as set forth in connection with the previous embodiments. Room R could be a large space for housing numerous heat generating devices H, e.g., a large number of servers or other computer equipment. An individual component of the configuration, generally designated by the reference numeral 800, is component 805, which is at the end of one row (of five) of five components, each connected to one another, e.g., structurally linked for stability and possible interconnectedness, e.g., the heat exchangers may have a single coolant flow therethrough or otherwise subdivided to assure adequate cooling capacity throughout the configuration 800.

As shown in FIG. 8, the positions of the individual fan units 820 in each component 805 may vary to suit the needed cooling requirements in the room R. By individually orienting the respective fan units 820 (and the angle of air flow by orienting the respective fans therein), particular cooling requirements for the room R or portions thereof may be addressed easily by slidably arranging the fan units 820. It should be understood, of course, that although the modular arrangement shown in FIG. 8 is square (5×5), any configuration is possible to meet the needs of the room R, e.g., 1×8, 2×4, 6×11, etc. As discussed, the modularity aspects of the present invention may be exploited either in overhead configurations, subfloor or combinations of each.

Additional patent applications of one of the inventors describe various features which may be implemented with the subject matter of the present invention, e.g., "System and Method for Separating Air Flows in a Cooling System", U.S. Ser. No. 09/088,981, filed Jun. 2, 1998, issued on Mar. 7, 2000, as U.S. Pat. No. 6,034,873; "System, Method and Apparatus for Purging Fluid", U.S. Ser. No. 09/088,755, filed Jun. 2, 1998, issued on Nov. 2, 1999, as U.S. Pat. No. 5,975,114; "Cooling System and Method for Distributing Cooled Air", U.S. Ser. No. 09/088,958, filed Jun. 2, 1998; and "Spray Hood Protector in a Fluid-Based Cooling System", U.S. Ser. No. 09/089,333, filed Jun. 2, 1998, which are incorporated herein by reference.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A cooling system for cooling heat generating devices within a room having a floor, a plurality of walls and a ceiling, said system comprising:
   at least one heat exchanger disposed substantially horizontal with respect to said floor and said ceiling; and
   a first fan unit disposed substantially and horizontally parallel and adjacent said at least one heat exchanger, said first fan unit being reconfigurably positioned along said at least one heat exchanger so as to direct air therefrom and blow said air into said room, thereby cooling said heat generating devices therein.

2. The cooling system according to claim 1, further comprising:
   a second fan unit, said second fan unit being substantially parallel and adjacent said first fan unit, said first and second fan units being reconfigurably and independently positioned along said at least one heat exchanger.

3. The cooling system according to claim 1, wherein said first fan unit comprises a plurality of fans.

4. The cooling system according the claim 3, wherein at least one of said fans is reconfigurably and independently positioned within said first fan unit.

5. The cooling system according to claim 3, wherein the speed of at least one of said fans is variably controlled.

6. The cooling system according to claim 5, wherein the speed of at least one of said fans is automatically controlled.

7. The cooling system according to claim 5, wherein the speed of at least one of said fans is manually controlled.

8. The cooling system according to claim 1, further comprising:
   a tray assembly disposed substantially and horizontally parallel to said at least one heat exchanger and said first fan unit, said first fan unit being positioned, upon said tray assembly and reconfigurably and independently positioned thereon.

9. The cooling system according to claim 8, wherein said first fan unit is slidingly engaged along said tray assembly.

10. The cooling system according to claim 1, wherein said at least one heat exchanger and said first fan unit are disposed below said floor of said room, said first fan unit directing said air upwards into said room, said floor having a permeability to said air.

11. The cooling system according to claim 10, wherein said first fan unit is disposed below said at least one heat exchanger, said first fan unit blowing said air through said at least one heat exchanger into said room, whereby said air is cooled twice in a cycle through said room.

12. The cooling system according to claim 10, wherein said first fan unit is disposed above said at lest one heat exchanger, said first fan unit drawing said air from said at least one heat exchanger and blowing said air into said room.

13. The cooling system according to claim 10, further comprising:
   a second fan unit disposed above said ceiling of said room, said second fan unit directing air downwards into said room, said ceiling having a permeability to said air.

14. The cooling system according to claim 13, further comprising:
   at least one additional heat exchanger disposed substantially and horizontally parallel and adjacent said second fan unit, said second fan unit directing air from said at least one additional heat exchanger into said room, whereby said air is cooled by said at least one heat exchanger and said at least additional heat exchanger when cycling through said room.

15. The cooling system according to claim 1, wherein said at least one heat exchanger and said first fan unit are disposed above said ceiling of room, said first fan unit directing said air downwards into said room.

16. The cooling system according to claim 15, wherein said first fan unit is disposed below said at least one heat exchanger, said first fan unit drawing said air through said at least one heat exchanger and blowing said air into said room.

17. The cooling system according to claim 15, wherein said first fan unit is disposed above said at least one heat exchanger, said first fan unit blowing said air through said at least one heat exchanger into said room.

18. The cooling system of claim 1, wherein a temperature of coolant passing through said at least one heat exchanger is variably controlled.

19. The cooling system according to claim 1, wherein said cooling system substantially covers an area of said room within said plurality of walls, said area having a position selected from the group consisting of: substantially along said floor and substantially along said ceiling.

20. The cooling system according to claim 19, wherein said area of said room covered by said cooling system is a portion of said room.

21. The cooling system according to claim 19, wherein said area of said room covered by said cooling system is substantially the area bounded by said plurality of walls.

22. A method for cooling heat generating devices within a room having a floor, a plurality of walls and a ceiling, said method comprising the steps of:

operating at least one heat exchanger to cool ambient air, said at least one heat exchanger being disposed substantially horizontally with respect to said floor and said ceiling; and directing, by a fan unit disposed substantially and horizontally parallel and adjacent said at least one heat exchanger, said cooled ambient air from said at least one heat exchanger into said room, said fan unit being reconfigurably positioned along said at least one heat exchanger, whereby said heat generating devices are cooled.

23. The method according to claim 22, further comprising the step of:

redirecting said fan unit at a different position along said at least one heat exchanger.

24. The method according to claim 22, further comprising the step of:

directing, by a second fan unit disposed substantially and horizontally parallel and adjacent said at least one heat exchanger, said cooled ambient air from said at least one heat exchanger into said room, said second fan unit being reconfigurably and independently positioned along said at least one heat exchanger.

25. The method according to claim 22, wherein said at least one heat exchanger comprises a plurality of heat exchangers, respective fan units being associated therewith.

26. The method according to claim 25, wherein said plurality of exchangers are interconnected.

27. The method according to claim 25, wherein said respective fan units are slidably and independently positioned along respective heat exchangers.

28. The method according to claim 22, wherein said fan unit directs said cooled ambient air downwards from said ceiling into said room.

29. The method according to claim 22, wherein said fan unit directs said cooled ambient air upwards from said floor into said room.

30. A method for cooling heat generating devices within a room having a floor, a plurality of walls and a ceiling, said method comprising the steps of:

operating at least two heat exchangers to cool ambient air, a first of said heat exchangers being disposed substantially horizontally adjacent said floor, and a second of said heat exchangers being disposed substantially horizontally adjacent said ceiling; and directing, by respective fan units disposed substantially and horizontally parallel and adjacent said first and second heat exchangers, said cooled ambient air from said first and second heat exchangers into said room, said fan units being reconfigurably positioned along said first and second heat exchangers, whereby said air circulates through said first and second heat exchangers and said room to cool said heat generating devices disposed therein.

* * * * *